United States Patent

Koshimura et al.

[11] Patent Number: 5,731,129
[45] Date of Patent: Mar. 24, 1998

[54] PHOTOSENSITIVE RESIN COMPOSITION COMPRISING A CARBOXYL GROUP-CONTAINING DIENE COPOLYMER AND A HYDROGENATED DIENE BLOCK POLYMER

[75] Inventors: Katsuo Koshimura; Takayoshi Tanabe; Hozumi Sato; Noboru Oshima; Takashi Nishioka; Yoshiharu Hashiguchi, all of Tokyo, Japan

[73] Assignee: Japan Synthetic Rubber Co., Ltd., Tokyo, Japan

[21] Appl. No.: 598,619

[22] Filed: Feb. 12, 1996

Related U.S. Application Data

[63] Continuation of Ser. No. 221,258, Mar. 31, 1994, abandoned.

[51] Int. Cl.$^6$ .................................................. G03C 1/73
[52] U.S. Cl. .................... 430/286.1; 430/281.1; 430/288.1; 430/285.1; 430/287.1
[58] Field of Search .................... 430/286.1, 281.1, 430/288.1, 285.1, 287.1

[56] References Cited

U.S. PATENT DOCUMENTS

| | | |
|---|---|---|
| 4,369,246 | 1/1983 | Chen . |
| 5,073,477 | 12/1991 | Kusuda et al. .................... 430/286 |
| 5,175,076 | 12/1992 | Ishikawa et al. .................... 430/286 |
| 5,348,844 | 9/1994 | Garmong .................... 430/286.1 |

FOREIGN PATENT DOCUMENTS

| | | |
|---|---|---|
| 0 396 780 | 11/1990 | European Pat. Off. . |
| 0 398 758 | 11/1990 | European Pat. Off. . |
| 0 489 553 | 6/1992 | European Pat. Off. . |
| 61-22339 | 1/1986 | Japan . |
| 1-300246 | 12/1989 | Japan . |

*Primary Examiner*—George F. Lesmes
*Assistant Examiner*—Laura Weiner
*Attorney, Agent, or Firm*—Oblon, Spivak, McClelland, Maier & Neustadt, P.C.

[57] ABSTRACT

A water-developable photosensitive resin composition which exhibits a small swelling, small reduction in strength and small dimension change when developed with water and which has an excellent balance of characteristics. Said composition comprises (1) a carboxyl group-containing diene polymer, (2) a hydrogenated diene block polymer in which at least 80% of the double bonds in the recurring unit consisting of conjugated diene has been hydrogenated, (3) a photopolymerizable ethylenically unsaturated monomer, (4) an amino group-containing compound and (5) a photopolymerization initiator.

10 Claims, No Drawings

PHOTOSENSITIVE RESIN COMPOSITION COMPRISING A CARBOXYL GROUP-CONTAINING DIENE COPOLYMER AND A HYDROGENATED DIENE BLOCK POLYMER

This application is a Continuation of application Ser. No. 08/221,258, filed on Mar. 31 1994, now abandoned.

BACKGROUND OF THE INVENTION

This invention relates to a novel photosensitive resin composition having a water-developability.

Various photosensitive resin compositions have heretofore been broadly utilized in fields such as photoresist, printing ink, plate making and the like.

Known photoresist compositions include a composition comprising a cyclic rubber and a bisazide compound; a composition comprising a thermoplastic elastomer, an acrylic monomer and a photopolymerization initiator, a composition comprising mainly a photosensitive resin such as polyester acrylate, epoxyacrylate, polyvinyl cinnamate, chloromethylated polystyrene, an aromatic azido group-containing resin or the like; etc., and these photosensitive resin compositions are all water-insoluble, and hence, organic solvents are used for developing the same. However, recently, the influences of the organic solvents on environment have become a problem in addition to their safety during working and their influences on health.

The compositions which have been known to solve the above problems are alkali-developable photosensitive resin compositions comprising a novolac resin or poly (vinylphenol) and a quinonediazide compound; however, there have been desired photosensitive resin compositions developable with safer and simpler neutral water.

As such water-developable, photosensitive resin compositions, there have been proposed those comprising a water-soluble resin as the base, for example, a composition consisting of a water-soluble resin such as polyvinyl alcohol, gelatin, casein or the like and a dichromate, a diazonium salt or a bisazide compound; a composition consisting of a water-soluble resin, a water-soluble acrylic monomer and a photopolymerization initiator; and the like.

However, conventional water-developable photosensitive resin compositions are swollen during development because the base resin used therein has too high an affinity to water, and hence, reduction in strength and change in dimension are caused. As a result, there are such problems that the dimension precision of resist is reduced, the printing resistance of a printing plate is reduced, the printing quality is reduced and the like.

In order to solve the problems of such water-developable photosensitive resin compositions, the present inventors have already clarified that a copolymer of a conjugated diene compound or an acrylic ester compound with an $\alpha,\beta$-ethylenicatly unsaturated carboxylic acid and a polyfunctional vinyl compound (referred to hereinafter as the copolymer (I)) is soluble in an aqueous alkali solution, and a water-developable photosensitive resin composition can be obtained by compounding the copolymer (I) with (II) a photopolymerizable unsaturated monomer, (III) a photopolymerization initiator and (IV) an amino group-containing compound (see, for example, Japanese Patent Application Kokai No. 60-170411, Japanese Patent Application Kokai No. 60-219208 and Japanese Patent Application Kokai No. 61-181811). However, as to these water-developable photosensitive resin compositions, it has been desired that the strength of a resin plate after exposure and development is further improved.

Also, there is known a water-developable photosensitive resin composition capable of forming a printing plate having good dimension stability and water resistance which comprises (a) a partial cross-linked copolymer obtained by emulsion polymerization of an aliphatic conjugated diene, an $\alpha,\beta$-ethylenically unsaturated carboxylic acid and a compound having at least two addition-polymerizable groups, (b) an aliphatic conjugated diene polymer, (c) a photopolymerizable unsaturated monomer, (d) a basic nitrogen atom-containing compound and (e) a photopolymerization initiator (see, for example, Japanese Patent Application Kokai No. 1-300246); however, even the above composition cannot solve such problems as strength reduction of resin plate after exposure and the like.

SUMMARY OF THE INVENTION

An object of this invention is to provide a novel, water-developable, photosensitive resin composition, which shows a small swell, small reduction in strength and small dimensional change when developed with water and has an excellent balance of characteristics.

Other objects and advantages of this invention will become apparent from the following description.

According to this invention, there is provided a photosensitive resin composition comprising:

(1) a carboxyl group-containing diene type cross-linkable copolymer composed of:
 (i) 40–95 mole % of a recurring unit consisting of a conjugated diene,
 (ii) 0.1–20 mole % of a recurring unit consisting of an $\alpha,\beta$-ethylenically unsaturated carboxylic acid,
 (iii) 0.1–10 mole % of a recurring unit consisting of a compound having at least two unsaturated groups in the molecule, and
 (iv) 0–40 mole % of a recurring unit consisting of at least one monomer selected from the group consisting of aromatic vinyl compounds, alkyl (meth) acrylates and acrylonitrile;

(2) a hydrogenated diene type block polymer having a number average molecular weight of 50,000 to 600,000 selected from the group consisting of an aromatic vinyl compound-conjugated diene block copolymer and conjugated diene block polymer wherein at least 80 mole % of the conjugated diene polymer portion has been hydrogenated;

(3) a photopolymerizable unsaturated compound;

(4) an amino group-containing compound; and (5) a photopolymerization initiator.

DETAILED DESCRIPTION OF THE INVENTION

Component (1)

The carboxyl group-containing diene type cross-linkable copolymer (1) (referred to hereinafter as the component (1)) is composed of:
 (i) 40–95 mole % of a recurring unit consisting of a conjugated diene,
 (ii) 0.1–20 mole % of a recurring unit consisting of an $\alpha,\beta$-ethylenically unsaturated carboxylic acid,
 (iii) 0.1–10 mole % of a recurring unit consisting of a compound having at least two polymerizable groups in the molecule, and (iv) 0–40 mole % of a recurring unit consisting of at least one monomer selected from the group consisting of aromatic vinyl compounds, alkyl (meth)acrylates and acryionitrile.

The component (1) is preferably a copolymer composed of:

(i') 70–95 mole % of a recurring unit consisting of at least one member selected from butadiene and isoprene, (ii') 0.5–5 mole % of a recurring unit consisting of an α,β-ethylenically unsaturated carboxylic acid, (iii') 0.5–5 mole % of a recurring unit consisting of an alkylene glycol di(meth)acrylate and/or divinylbenzene, and (iv') 5–30 mole % of a recurring unit consisting of at least one monomer selected from the group consisting of aromatic vinyl compounds, alkyl (meth)acrylates and acrylonitrile, said copolymer (1) being in the form of particles having an average particle diameter of 0.02–1 μm.

In the above carboxyl group-containing diene type crosslinkable copolymer (1), the contents of the conjugated diene (i), the α,β-ethylenically unsaturated carboxylic acid (ii) and the compound having at least two unsaturated groups are such that the content of the conjugated diene (i) is 40–95 mole %, preferably 50–80 mole %, the content of the α,β-ethylenically unsaturated carboxylic acid (ii) is 0.1–20 mole %, preferably 0.5–10 mole %, and the content of the compound having at least two unsaturated groups (iii) is 0.1–15 mole %, preferably 0.5–10 mole %.

In this case, when the content of the conjugated diene (i) is less than 40 mole %, the strength of the composition after the exposure tends to be lowered, while when it exceeds 95 mole % there is a fear that the water-developability of the composition may become insufficient. Also, when the content of the α,β-ethylenically unsaturated carboxylic acid (ii) is less than 0.1 mole %, the water-developability of the composition becomes insufficient in some cases, and when it exceeds 20 mole %, the composition after the exposure tends to become hard and brittle. Moreover, when the content of the compound having at least two unsaturated groups (iii) is less than 0.1 mole %, there is a fear that the water-developability of the composition may become low, and when it exceeds 15 mole %, the compatibility of the component (1) with the photopolymerizable unsaturated monomer (3) is deteriorated and the processability is lowered, simultaneously with which the strength of the composition after the exposure becomes insufficient in some cases.

The conjugated diene (i) includes, for example, 1,3-butadiene, isoprene, 1,3-pentadiene, 1,3-hexadiene, 2,3-dimethylbutadiene, 4,5-diethyl-1,3-octadiene, 3-butyl-1,3-octadiene, chloroprene, 2,3-dichlorobutadiene, 1,3-cyclopentadiene and the like. Preferable are 1,3-butadiene and isoprene.

These conjugated dienes (i) may be used alone or in admixture of two or more.

The α,β-ethylenically unsaturated carboxylic acid (ii) includes, for example, (meth)acrylic acid, itaconic acid, itaconic anhydride, maleic acid, maleic anhydride, fumaric acid, crotonic acid, citraconic acid, mesaconic acid, cinnamic acid and the like, and also includes esters having a free carboxyl group such as monomethyl, monoethyl and monopropyl esters of itaconic, maleic, fumaric, citraconic and mesaconic acids; a monoester of 2-hydroxyethyl (meth) acrylate with phthalic or succinic acid; and the like. Preferable examples of the component (ii) are acrylic acid, methacrylic acid, crotonic acid, cinnamic acid, itaconic acid, maleic acid and a monoester of 2-hydroxyethyl (meth) acrylate with phthalic or succinic acid.

These α,β-ethylenically unsaturated carboxylic acids (ii) may be used alone or in admixture of two or more.

The compound having at least two unsaturated groups (iii) includes, for example, di(meth)acrylates of alkylene glycols such as ethylene glycol, propylene glycol, 1,4-butanediol, 1,5-pentanediol, 1,6-hexanediol and the like; di(meth) acrylates of polyalkylene glycols (the number of alkylene glycol units=2–23) such as polyethylene glycol, polypropylene glycol and the like; polymers having hydroxyl groups at both terminals such as di(meth)acrylates having terminal hydroxy groups, polybutadiene having terminal hydroxyl groups, polyisoprene having terminal hydroxyl groups, butadieneacrylonitrile copolymer having terminal hydroxyl groups, polycaprolactone having terminal hydroxyl groups and the like; oligo(meth)acrylates of trihydric or more polyhydric alcohols such as glycerine, 1,2,4-butanetriol, trimethylolalkane (the number of carbon atoms of the alkane is, for example, 1–3), tetramethylolalkane (the number of carbon atoms of the alkane is, for example, 1–3), pentaerythritol and the like; oligo(meth)acrylates of polyalkylene glycol adducts of trihydric or more polyhydric alcohols; di(meth)acrylates of cyclic polyols such as 1,4-cyclohexanediol, 1,4-benzenediol and the like; oligo(meth) acrylates such as polyester (meth)acrylate, epoxy(meth) acrylate, urethane (meth)acrylate, alkyd resin (meth) acrylate, silicone resin (meth)acrylate, spiran resin (meth) acrylate and the like; bis(meth)acrylamides such as N,N'-methylene bis(meth)acrylamide, N,N'-ethylene bis(meth) acrylamide, N,N'-hexamethylene bis(meth)acrylamide and the like; polyvinyl aromatic compounds such as divinylbenzene, diisopropenylbenzene, trivinylbenzene and the like; unsaturated alcohol esters of polycarboxylic acids such as divinyl phthalate, diallyl phthalate and the like; polyfunctional unsaturated ethers such as divinyl ether, diallyl ether and the like; etc. Preferable are ethylene glycol di(meth)acrylate, propylene glycol di(meth)acrylate, divinylbenzene, hexanediol di(meth)acrylate, pentaerythritol tri(meth)acrylate, pentaerythritol tetra(meth)acrylate and trimethylolpropane tri(meth)acrylate.

These compounds having at least two unsaturated groups (iii) may be used alone or in admixture of two or more.

Moreover, other monomeric components (iv) than the components (i) to (iii) include specifically the following compounds though they are not critical: styrene, α-methylstyrene, o-methylstyrene, m-methylstyrene, p-methylstyrene, p-t-butylstyrene, o-chlorostyrene, m-chlorostyrene, p-chlorostyrene, 1,1-diphenylethylene, N,N-dimethyl-p-aminostyrene, N,N-diethyl-p-aminostyrene, vinylpyridine, vinylpiperidine, vinylpyrrolidone, (meth)acrylonitrile, α-chloroacrylonitrile, α-chloromethylacrylonitrile, α-methoxyacrylonitrile, α-ethoxyacrylonitrile, crotononitrile, cinnamonitrile, itaconic acid dinitrile, maleic acid dinitrile, fumaric acid dinitrile, (meth)acrylamide, N-hydroxymethyl(meth) acrylamide, N-(2-hydroxyethyl)(meth)acrylamide, N,N-bis (2-hydroxyethyl)(meth)acrylamide, crotonic acid amide, cinnamic acid amide, methyl (meth)acrylate, ethyl (meth) acrylate, n-propyl (meth)acrylate, isopropyl (meth)acrylate, n-butyl (meth)acrylate, isobutyl (meth)acrylate, sec-butyl (meth)acrylate, t-butyl (meth)acrylate, n-amyl (meth) acrylate, n-octyl (meth)acrylate, 2-ethylhexyl (meth) acrylate, lauryl (meth)acrylate, stearyl (meth)acrylate, methyl crotonate, ethyl crotonate, propyl crotonate, butyl crotonate, methyl cinnamate, ethyl cinnamate, propyl cinnamate, butyl cinnamate, dimethyl itaconate, diethyl itaconate, dimethyl maleate, diethyl maleate, dimethyl fumarate, diethyl fumarate, vinyl chloride, vinylidene chloride, vinyl acetate, allyl acetate and the like. Preferable are styrene, acrylonitrile, methyl (meth)acrylate, ethyl (meth)acrylate, 2-ethylhexyl (meth)acrylate, methoxyethyl acrylate, methoxydiethylene glycol monoacrylate, methoxydipropylene glycol monoacrylate and lauryl (meth)acrylate.

It is preferable that the carboxyl group-containing diene type cross-linkable copolymer (1) is in the particle form. Such particle form component (1) can be directly prepared by, for example, an emulsion polymerization, suspension polymerization, precipitation polymerization or the like using a radical polymerization initiator, or alternatively by pulverizing a previously produced bulk polymer, or obtaining a polymer in the form of particles from a polymer solution. The particle form component (1) is preferably prepared by an emulsion polymerization or a suspension polymerization, and particularly preferably by an emulsion polymerization from the viewpoint of particle size, uniformity of particle diameters and the like.

The average particle diameter of the component (1) is preferably 0.02–1 µm, more preferably 0.04–0.3 µm.

The above-mentioned radical polymerization initiator includes, for example, organic peroxides such as benzoylperoxide, lauroylperoxide, cumenehydroperoxide, paramenthanehydroperoxide, di-t-butylperoxide and the like; azo compounds such as 2,2'-azobisisobutyronitrile, 2,2'-azobisisovarelonitrile, 2,2'-azobisisocapronitrile and the like; inorganic peroxides such as potassium persulfate, ammonium persulfate, hydrogen peroxide and the like; redox system catalysts composed of said organic peroxide or inorganic peroxide and a reducing agent such as an organic amine, ferrous sulfate, sodium sulfite, sodium thiosulfate, sodium formaldehydesulfoxylate, L-ascorbic acid, sulfinic acid or the like; etc.

The emulsifier which may be used in the above emulsion polymerization includes anionic surfactants, nonionic surfactants, cationic surfactants, amphoteric surfactants and the like, and particularly preferable are anionic surfactants and nonionic surfactants. These surfactants may be fluorine-containing surfactants. Also, in the emulsion polymerization, the following suspension stabilizers or tackifiers may be used along with the emulsifiers: polyvinyl alcohol, polysodium acrylate, methyl vinyl ether-maleic anhydride copolymer, water-soluble polyether, hydroxyethyl cellulose, carboxymethyl cellulose, starch, gelatin, casein, alginic acid salts and the like.

In the above polymerization, reactants such as monomer, radical polymerization initiator and the like may be added at one time before the start of the reaction, or a part or the whole thereof may be added in portions or continuously after the start of the reaction. The polymerization reaction is preferably conducted at 0°–60° C. an oxygen-free atmosphere (for example, nitrogen), and in the middle of the reaction, operation conditions such as temperature, stirring speed and the like may be adequately varied. The polymerization reaction may be conducted either by a continuous system or a batchwise system.

Component (2)

The hydrogenated diene type block polymer used in this invention (referred to hereinafter as the component (2)) is a block polymer selected from the group consisting of aromatic vinyl compound-conjugated diene block copolymer (preferably having a bound aromatic vinyl compound content of 40% by weight or less) and conjugated diene block polymer (block polymer having plural polymeric segments having different microstructures), said block polymer having a number average molecular weight of 50,000 to 600,000, preferably 100,000 to 400,000 and at least 80 mole %, preferably at least 90 mole %, of the conjugated diene polymer portion in the said block polymer having been hydrogenated.

The component (2) used in this invention is preferably one consisting of a soft segment Y and a hard segment X or Z and having a block structure such as X—Y—X, X—Y—Z, Z—Y—Z or the like.

The soft segment Y is a segment composed of a conjugated diene polymer or a conjugated diene type copolymer in which not more than 30% by weight, preferably 10–30% by weight, of an aromatic vinyl compound is copolymerized with at least 70% by weight of a conjugated diene, and in this segment, the vinyl content of the microstructure of the conjugated diene polymer portion is 25–90 mole %, preferably 30–85 mole %, and said segment occupies 50–95% by weight of the component (2).

When the bound aromatic vinyl compound content of the segment Y exceeds 30% by weight, the rubbery properties are lost. Also, when the vinyl content is less than 25 mole % or more than 90 mole %, the rubbery properties are lost.

When the soft segment Y is a conjugated diene polymer having the above-mentioned vinyl content or an aromatic vinyl compound-conjugated diene copolymer having the above-mentioned vinyl content, the polymer or copolymer exhibits, when hydrogenated, properties like a rubber in which ethylene linkage and butylene linkage are connected at random.

The hard segment X is composed of an aromatic vinyl compound polymer or an aromatic vinyl compound conjugated diene copolymer in which 45% by weight or more of aromatic vinyl compound is copolymerized with 55% by weight or less of conjugated diene. In the case of the aromatic vinyl compound-conjugated diene copolymer, there may be adequately used those in which the proportion of the aromatic vinyl compound increases gradually toward the polymer end or the aromatic vinyl compound recurring unit and the conjugated diene recurring unit are bonded at random.

The hard segment Z is a segment composed of a conjugate diene polymer or a conjugated diene-aromatic vinyl compound copolymer in which less than 45% by weight of an aromatic vinyl compound is copolymerized with more than 55% by weight of a conjugated diene or is an aromatic vinyl compound-conjugated diene random copolymer segment, in which segment the microstructure of the conjugated diene polymer portion has a vinyl content of 20 mole % or less. When the vinyl content is more than 20 mole %, the hydrogenated product thereof does not become resinous (hard).

When the structures of X, Y and Z do not fall within the above-mentioned ranges, the appearance of a molded article of the photosensitive resin composition is impaired if the component (2) is rubbery. Also, if the component (2) is resinous, the impact resistance, particularly impact resistance at low temperature, of the photosensitive resin composition after exposure becomes insufficient.

The conjugated diene composing the component (2) includes 1,3-butadiene, isoprene, 1,3-pentadiene, 1,3-hexadiene, 2,3-dimethylbutadiene, 4,5-diethyl-1,3-octadiene, 3-butyl-1,3-octadiene, chloroprene, 2,3-dichlorobutadiene, 1,3-cyclopentadiene and the like. Among them, 1,3-butadiene, isoprene and 1,3-pentadiene are preferable in order to obtain a hydrogenated diene type copolymer which is easy to utilize in industry and excellent in physical properties.

The aromatic vinyl compound composing the component (2) includes styrene, α-methylstyrene, o-methylstyrene, m-methylstyrene, p-methylstyrene, p-t-butylstyrene, divinylbenzene, diisopropenylstyrene, o-chlorostyrene, m-chlorostyrene, p-chlorostyrene, 1,1-diphenylethylene, N,N-dimethyl-p-aminostyrene, N,N-diethyl-p-aminostyrene, vinylpyridine and the like. Particularly preferable aromatic vinyl compounds are styrene and α-methylstyrene.

Preferable combinations of segments X, Y and Z composing the component (2) are shown below.

a) X—Y—X type in which X is an aromatic vinyl polymer block or an aromatic vinyl compound-conjugated diene copolymer block in which 45% by weight or more of an aromatic vinyl compound is copolymerized at random or so that the proportion of aromatic vinyl compound increases gradually toward the polymer end; Y is a conjugated diene-aromatic vinyl compound copolymer block in which 10–30% by weight of an aromatic vinyl compound is copolymerized and the vinyl content in the conjugated diene polymer portion is 30–85 mole %, said copolymer block occupying 40–95% by weight of the block polymer.

b) X—Y'—Z type in which X is as defined above; Y' is a conjugated diene polymer block having a vinyl content of 30–85 mole % and occupying 40–80% by weight of the block polymer; and Z is a conjugated diene-aromatic vinyl compound random copolymer block in which less than 45% by weight of an aromatic vinyl compound is copolymerized and the vinyl content in the microstructure of the conjugated diene polymer portion is less than 20 mole % or a conjugated diene polymer block having a vinyl content of less than 20 mole %.

c) Z—Y'—Z type in which Z and Y' are the same as in b) above.

The amount of the component (2) may be appropriately varied depending upon the purpose of use of the composition, and is preferably 0.1–100 parts by weight, more preferably 1–90 parts by weight and most preferably 2–70 parts by weight, per 100 parts by weight of the component (1). When the amount of the component (2) is less than 0.1 part by weight, the strength of the composition after the exposure becomes insufficient in some cases, and when it exceeds 100 parts by weight, the water-developability of the composition tends to be lowered.

The block polymer of the component (2) can be prepared by a known living anionic polymerization method using an organolithium catalyst. The polymerization is effected using n-butyllithium, sec-butyllithium, dilithiumbutane or the like at −30°–150° C., preferably 0°–130° C., in a hydrocarbon solvent such as pentane, hexane, heptane, cyclohexane or the like. The polymerization is effected at a constant temperature or while the temperature is elevated without removing heat.

The vinyl content of the conjugated diene polymer can be controlled in a range of 10–90 mole % by adding an appropriate amount of a polar compound (a vinyl content controlling agent) such as tetrahydrofuran, diethyl ether, ethylene glycol dibutyl ether, tetramethylethylenediamine or the like to the polymerization system.

In the aromatic vinyl compound-conjugated diene copolymer, in order for the aromatic vinyl compound to be copolymerized at random with the conjugated diene, there is a method in which both the monomers are added to the polymerization system little by little at a constant rate or a method in which a randomizing agent is allowed to be present during the polymerization. The bound aromatic vinyl compound can be made of the gradually increasing type by effecting the polymerization in the presence of an aromatic vinyl compound and a conjugated diene in the absence of an effective amount of a randomizing agent.

The living anionic polymerization with an organolithium catalyst is a well-known method; and also, when an active lithium is present at the polymer terminals, a coupling agent can be added in the desired amount to bond 2–4 polymer chains.

The coupling agent includes, for example, diethyladipate, divinylbenzene, tetrachlorosilicon, butyltrichlorosilicon, tetrachlorotin, butyltrichlorotin, dimethyldichlorosilicon, tetrachlorogermanium, 1,2-dibromoethane, 1,4-di (chloromethyl)benzene, bis(trichlorosilyl)ethane, epoxidized linseed oil, tolylene diisocyanate, 1,2,4-benzene triisocyanate and the like.

The bound aromatic vinyl compound content of the above block copolymer is adjusted by controlling the amount of the monomers fed in each polymerization step, and the vinyl content of the conjugated diene portion is adjusted by varying the amount of the above-mentioned vinyl content controlling agent fed. Moreover, these contents are adjusted by varying the number average molecular weight, polymerization initiator and the amount of, for example, n-butyllithium added.

The hydrogenated conjugated diene type block polymer (2) used in this invention can be prepared by dissolving the thus obtained block copolymer in an inert solvent and subjecting the resulting solution to hydrogenation in the presence of a hydrogenation catalyst at 20°–150° C. at a hydrogen pressure of 1–100 kg/cm².

The inert solvent used in the hydrogenation includes hydrocarbon solvents such as hexane, heptane, cyclohexane, benzene, toluene, ethylbenzene and the like, and polar solvents such as methyl ethyl ketone, ethyl acetate, diethyl ether, tetrahydrofuran and the like.

The hydrogenation catalyst includes dicyclopentadienyltitanium halides, nickel organic carboxylates, hydrogenation catalysts consisting of nickel organic carboxylates and organometallic compounds of metals of Groups I to III; nickel, platinum, palladium, ruthenium, rhenium and rhodium metal catalysts supported on carriers such as carbon, silica, diatomaceous earth and the like; metallic catalysts such as cobalt, nickel, rhodium and ruthenium; lithiumaluminum halides; p-toluenesulfonyl hydrazide; and hydrogen-storing alloys such as Zr—Ti—Fe—V—Cr alloy, Zr—Ti—Nb—Fe—V—Cr alloy, LaNi₅ alloy and the like; etc.

The hydrogenation degree of the double bonds of the conjugated diene portion of the hydrogenated diene type block polymer may be adjusted by changing the amounts of the hydrogenation catalyst and hydrogenated compound or the hydrogen pressure and reaction time during the hydrogenation reaction.

The catalyst residue is removed from the hydrogenated block polymer solution, a phenol type or amine type antioxidant is added thereto, and the hydrogenated diene type block polymer is easily isolated from the polymer solution.

The isolation of the hydrogenated diene type block polymer can be effected by, for example, a method in which acetone, an alcohol or the like is added to the polymer solution to precipitate the polymer, a method in which the polymer solution is poured into hot water with stirring to remove the solvent by distillation, or the like.

Component (3)

The photopolymerizable unsaturated monomer (referred to hereinafter as the component (3)) has a compound having unsaturated groups capable of being polymerized upon irradiation with light in the presence of the photopolymerization initiator (5) which is described hereinafter.

The component (3) includes, for example, aromatic vinyl compounds such as styrene, α-methylstyrene, o-methylstyrene, m-methylstyrene, p-methylstyrene, p-t-butylstyrene, divinylbenzene, diisopropenylbenzene, o-chlorostyrene, m-chlorostyrene, p-chlorostyrene, 1,1-diphenylethylene, p-methoxystyrene, N,N-dimethyl-p-aminostyrene, N,N-diethyl-p-aminostyrene, vinylpyridine and the like; unsaturated nitriles such as (meth)acrylonitrile, α-chloroacrylonitrile, α-chloromethylacrylonitrile, α-methoxyacrylonitrile, crotononitrile, cinnamonitrile, itaconic acid dinitrile, maleic acid dinitrile, fumaric acid dinitrile and the like; alkyl (meth)acrylates such as methyl(meth) acrylate, ethyl (meth)acrylate, n-propyl (meth)acrylate, isopropyl (meth)acrylate, n-butyl (meth)acrylate, isobutyl (meth)acrylate, sec-butyl (meth)acrylate, t-butyl (meth) acrylate, n-amyl (meth)acrylate, n-octyl (meth)acrylate, stearyl (meth)acrylate, lauryl (meth)acrylate, 2-ethylhexyl (meth)acrylate and the like; unsaturated carboxylic acid esters such as methyl crotonate, ethyl crotonate, propyl crotonate, butyl crotonate, methyl cinnamate, ethyl cinnamate, propyl cinnamate, dimethyl itaconate, diethyl itaconate, dimethyl maleate, diethyl maleate, dimethyl fumarate, diethyl fumarate and the like; fluoroalkyl (meth) acrylates such as trifluoroethyl (meth)acrylate, pentafluoropropyl (meth)acrylate, heptafluorobutyl (meth)acrylate and the like; hydroxyalkyl (meth)acrylates such as 2-hydroxyethyl (meth)acrylate, 2-hydroxypropyl (meth) acrylate, 3-hydroxypropyl (meth)acrylate and the like; mono (meth)acrylates of polyalkylene glycols such as polyethylene glycol, polypropylene glycol and the like; alkoxyalkyl (meth)acrylates such as 2-methoxyethyl (meth)acrylate, 2-ethoxyethyl (meth)acrylate, 2-methoxypropyl (meth) acrylate, 2-ethoxypropyl (meth)acrylate, 3-methoxypropyl (meth)acrylate, 3-ethoxypropyl (meth)acrylate and the like; cyanoalkyl (meth)acrylate such as cyanoethyl(meth) acrylate, cyanopropyl (meth)acrylate and the like; aryloxyalkyl (meth)acrylates such as 2-phenoxyethyl (meth) acrylate, 2-phenoxypropyl (meth)acrylate, 3-phenoxypropyl (meth)acrylate and the like; mono(meth)acrylates of alkoxypolyalkylene glycols such as methoxypolyethylene glycol, ethoxypolyethylene glycol, methoxypolypropylene glycol, ethoxypolypropylene glycol and the like; mono(meth) acrylates of aryloxypolyalkylene glycols such as phenoxypolyethylene glycol, phenoxypolypropylene glycol and the like; di(meth)acrylates of alkylene glycols such as ethylene glycol, propylene glycol, 1,4-butanediol, 1,5-pentanediol, 1,6-hexanediol and the like; di(meth)acrylates of polyalkylene glycols (having 2–23 alkylene glycol units) such as polyethylene glycol, polypropylene glycol and the like; diene-type and/or di(meth)acrylates of polymers having hydroxyl groups at both terminals such as polybutadiene having hydroxyl groups at both terminals, polyisoprene having hydroxyl groups at both terminals, butadiene-acrylonitrile copolymer having hydroxyl groups at both terminals, polycaprolactone having hydroxyl groups at both terminals and the like; oligo(meth)acrylates such as tri- and tetra(meth)acrylates of trihydric or more polyhydric alcohols such as glycerin, 1,2,4-butanetriol, trimethylol alkane (the alkane having 1–3 carbon atoms), tetramethylol alkane (the alkane having 1–3 carbon atoms), pentaerythritol and the like; oligo(meth)acrylates such as tri- and tetra(meth) acrylates of polyalkytene glycol adducts of trihydric or more polyhydric alcohols and the like; di(meth)acrylates of cyclic polyols such as 1,4-cyclohexanediol, 1,4-benzenediol, 1,4-dihydroxyethylbenzene and the like; oligo(meth)acrylates such as polyester (meth)acrylate, epoxy(meth)acrylate, urethane (meth)acrylate, alkyd resin (meth)acrylate, silicone resin (meth)acrylate, spiran resin (meth)acrylate and the like; unsaturated carboxylic acids such as (meth)acrylic acid, crotonic acid, cinnamic acid, itaconic acid, itaconic anhydride, maleic acid, maleic anhydride, fumaric acid, citraconic acid, mesaconic acid and the like; free-carboxyl group-containing esters such as monomethyl, monoethyl, monopropyl, monobutyl, monohexyl and monooctyl esters of unsaturated polycarboxylic acids such as itaconic acid, maleic acid, fumaric acid, citraconic acid, mesaconic acid and the like; esters such as dimethyl, diethyl, dipropyl, dibutyl, dihexyl and dioctyl esters of unsaturated polycarboxylic acids such as itaconic acid, maleic acid, fumaric acid, citraconic acid, mesaconic acid and the like; unsaturated amides such as (meth)acrylamide, N-hydroxymethyl (meth)acrylamide, N-(2-hydroxyethyl) (meth)acrylamide, N,N'-methylene bis(meth)acrylamide, N,N'-ethylene bis (meth)acrylamide, N,N'-hexamethylene bis(meth) acrylamide, crotonamide, cinnamamide and the like; halogenated vinyl compounds such as vinyl chloride, vinylidene chloride and the like; unsaturated alcohol esters such as vinyl acetate, allyl acetate, divinyl phthalate, diallyl phthalate and the like; cycloolefins such as cyclopentane, dicyclopentadiene, ethylidene norbornene, norbornadiene and the like.

These components (3) may be used alone or in admixture of two or more. In this invention, it is possible to impart the desired characteristics to the composition after the exposure by selecting appropriately the components (3) and combinations thereof.

The fluidity of the composition of this invention may be freely varied from waxy or rubbery to low viscosity liquid depending upon the amount of the component (3) added. Accordingly, the amount of the component (3) added may be appropriately varied depending upon the purpose of use of the composition; however, it is preferably 10–10,000 parts by weight, more preferably 20–1,000 parts by weight, per 100 parts by weight of the component (1). When the amount of the component (3) added is less than 10 parts by weight, the strength of the composition after the exposure tends to be lowered, and when it exceeds 10,000 parts by weight, the shrinkage of the composition after the exposure is large and it becomes difficult for the water-developability of the composition and the water-resistance of the composition after the exposure to consist with each other and the freedom for viscosity design of the composition tends to become small.

Component (4)

The amino group-containing compound (4) (referred to hereinafter as the component (4)) is a compound having at least one primary or secondary amino group.

The component (4) includes, for example, primary amines such as methylamine, ethylamine, propylamine, butylamine and the like; secondary amines such as dimethylamine, methylethylamine, diethylamine, methylpropylamine, ethylpropylamine, dipropylamine, methylbutylamine, ethylbutylamine, propylbutylamine, dibutylamine and the like; tertiary amines, for example, trialkylamines such as trimethylamine, methyldiethylamine, dimethylethylamine, triethylamine, dimethylpropylamine, methylethylpropylamine, diethylpropylamine, methyldipropylamine, ethyldiproplyamine, tripropylamine, dimethylbutylamine, methyldibutylamine, methylethylbutylamine, diethylbutylamine, ethyldibutylamine, methylpropylbutylamine, ethylpropylbutylamine, dipropylbutylamine, propyldibutylamine, tributylamine and the like; tertiary amines of alkylalkanols such as dimethylethanolamine, methyldiethanolamine, diethylethanolamine, ethyldiethanolamine and the like; trialkanolamines such as triethanolamine, diethanolpropanolamine, ethanoldipropanolamine, tripropanolamine and the like; N,N-dialkylaminoalkoxyalkanols such as N,N-dimethylaminoethoxyethanol, N,N-diethylaminoethoxyethanol, N,N-dimethylaminoethoxypropanol, N,N-diethylaminoethoxypropanol and the like; N,N-dialkylaminoalkyl (meth)acrylates such as N,N-dimethylaminoethyl (meth)acrylates, N,N-diethylaminoethyl (meth)acrylate, dipropylaminoethyl (meth)acrylate, N,N-dimethylaminopropyl (meth)acrylate, N,N-diethylaminopropyl (meth)acrylate, N,N-dipropylaminopropyl (meth)acrylate and the like; N,N-dialkylaminoalkoxyalkyl (meth)acrylates such as N,N-dimethylaminoethoxyethyl (meth)acrylate, N,N-diethylaminoethoxyethyl (meth)acrylate and the like; tertiary amino group-containing (meth)acrylamides such as N-(N',N'-dimethylaminoethyl) (meth)acrylamide, N-(N',N'-diethylaminoethyl) (meth)acrylamide, N-(N',N'-dimethylaminopropyl) (meth)acrylamide, N-(N',N'-diethylaminopropyl) (meth)acrylamide and the like; tertiary amino group-containing carbamates such as N,N-dimethylaminoethyl-N'-(meth)acryloylcarbamate, N,N-diethylaminoethyl-N'-(meth)acryloylcarbamate and the like.

These components (4) may be used alone or in admixture of two or more.

The component (4) is preferably a tertiary amine because of good water-developability, and more preferably a compound having α,β-ethylenic unsaturation such as a tertiary amino group-containing (meth)acrylamide, a tertiary amino group-containing (meth)acrylamide or the like in view of the strength of the composition after the exposure.

The amount of the component (4) added can be varied appropriately depending upon the purpose of use of the composition; however, the component (4) is used in such an amount that the amino group content becomes preferably 0.5 mole or more, more preferably 0.8 mole or more, per mole of the carboxyl group in the component (1). When the amino group content in the component (4) is less than 0.5 mole per mole of the carboxyl group in the component (1), the water-developability of the composition becomes insufficient in some cases, provided that even if the amino group content exceeds 2 moles the water-developability of the composition is not necessarily much more enhanced.

In this invention, there may be cases where the component (3) and the component (4) are the same as and different from each other. In these cases, the proportions of these components added to the component (1) are adjusted so that the components (3) and (4) satisfy simultaneously the above-mentioned preferable ranges thereof.

Component (5)

The photopolymerization initiator (5) (referred to hereinafter as the component (5)) is a component capable of initiating or sensitizing the polymerization of the above-mentioned component (3) upon irradiation with light, and in the preferable embodiment in this invention, also initiating or sensitizing the polymerization of a compound having α,β-ethylenically unsaturated groups among the component (4) compounds.

The component (5) includes, for example, α-diketone compounds such as diacetyl, methylbenzyl formate, benzil and the like; acyloins such as benzoin, pivaloin and the like; acyloin ethers such as benzoin methyl ether, benzoin ethyl ether, benzoin isopropyl ether, benzoin isobutyl ether and the like; polynuclear quinones such as anthraquinone, 2-ethylanthraquinone, 2-t-butylanthraquinone, 1,4-naphthoquinone and the like; acetophenones such as acetophenone, 2-hydroxy-2-methylpropiophenone, 1-hydroxycyclohexyl phenyl ketone, 2,2-dimethoxyphenylacetophenone, 2,2-diethoxyacetophenone, trichloroacetophneone and the like; benzophenones such as benzophenone, methyl o-benzoylbenzoate, Michler's ketone and the like; xanthones such as xanthone, thioxanthone, 2-chlorothioxanthone and the like; etc.

The amount of the component (5) added is preferably 0.1–20 parts by weight, more preferably 1–10 parts by weight, per 100 parts by weight of the component (1). When the amount is less than 0.1 part by weight, there is a fear that the photocuring of the composition may become insufficient, and even if the amount is more than 20 parts by weight, not all of the component (5) added participates in the photocuring and hence such an amount is not economical and makes the uniform dispersion of the component (5) difficult in some cases because the component (5) is inferior in compatibility with the components (3) and (4). Therefore, such an amount is not desirable.

Also, the composition of this invention may contain, if necessary, various additives.

The above additives include thermal addition polymerization inhibitors which act as a storage stabilizer.

The thermal addition polymerization inhibitor includes, for example, hydroxy-aromatic compounds such as hydroquinone, hydroquinone monomethyl ether, mono-t-butylhydroquinone, catechol, p-t-butylcatechol, p-methoxyphenol, 2,6-di-t-butyl-p-cresol, 2,6-di-t-butyl-m-cresol, pyrogallol, β-naphthol and the like; quinones such as benzoquinone, 2,5-diphenyl-p-benzoquinone, p-toluquinone, p-xyloquinone and the like; nitro compounds or nitron compounds such as nitrobenzene, m-dinitrobenzene, 2-methyl-2-nitrosopropane, α-phenyl-t-butylnitron, 5,5-dimethyl-1-pyrroline-1-oxide and the like; amines such as chloranyl amine type, diphenylamine, diphenylpicrylhydrazine, phenol-α-naphthylamine, pyridine, phenothiazine and the like; sulfides such as dithiobenzoyl sulfide, 1,1-benzyltetrasulfide and the like; unsaturated compounds such as 1,1-diphenylethylene α-methylthioacrylonitrile and the like; thiazine dyes such as thionine blue, toluidine blue, methylene blue and the like; stable radicals such as 1,1-diphenyl-2-picrylhydrazyl, 1,3,5-triphenylpherdazyl, 4-hydroxy-2,2,6,6-tetramethylpiperidin-1-oxyl, 2,6-di-t-butyl-α-(3,5-di-t-butyl)-4-oxo-2,5-cyclohexadien-1-ylidene-p-trioxane and the like; etc.

The amount of the thermal addition polymerization inhibitor added is, for example, about 0.001–2.0 parts by weight per 100 parts by weight of the total photosensitive resin composition.

Moreover, other additives include antioxidants, fillers, reinforcing materials, plasticizers, halation-preventors, adhesion aids and the like.

The composition of this invention can be obtained by thoroughly mixing the components (1), (2), (3), (4) and (5) together with various additives which are optionally added usually with warming by means of, for example, a kneader, intermixer or the like. The composition obtained can be freely adjusted to a fluidity-free waxy or rubbery state to a low viscosity liquid state having a good fluidity, and the degree of fluidity can be varied depending upon the purpose of use of the composition. In particular, when a low viscosity composition is desired, a solvent can be added in an adequate amount.

When a photosensitive resin plate is molded from the composition of this invention, various methods can be adopted depending upon the fluidity of the composition.

For example, when the composition has no or low fluidity, the composition is passed through a spacer having an adequate clearance, coated on an adequate substrate by a coating means such as roll coater or the like, or subjected to compression molding, extrusion molding, calendering or the like to form a film having a desired thickness.

Also, when the composition has a good fluidity, the composition can be coated on an substrate by an adequate coating method such as roll coating, calender coating, doctor blade coating, air-knife coating or the like to form a photosensitive resin plate. In particular, it is useful as a resist suitable for spin-coating.

These photosensitive resin plates or resists are exposed to chemically active rays such as ultraviolet rays or the like through a negative film having the desired pattern or the like, washed with water to remove the unexposed portions and then dried to form a clear relief image. In this case, if necessary, it can be subjected to exposure again after the drying.

DESCRIPTION OF PREFERRED EMBODIMENTS

This invention isexplained in more detail below referring to Examples and Comparative Examples; however, this invention is not limited thereto. In the Examples and Comparative Examples, part is by weight unless otherwise specified.

Production of Component (1)

1-1:

A monomer mixture having a composition of butadiene/ methacrylic acid/ethylene glycol dimethacrylate/ethyl acrylate=84.1/2.2/1.2/12.5 (mole %) was subjected to emulsion polymerization using sodium laurylsulfate as an emulsifier and 2,2'-azobisisobutyronitrile as a polymerization initiator. After the polymerization, the emulsion obtained was subjected to salting-out and coagulating with calcium chloride, water-washing and drying to produce a carboxyl group-containing diene type copolymer in the form of particles having an average particle size of 0.071 µm [referred to hereinafter as Copolymer (1-1)].

1-2:

A monomer mixture having a composition of butadiene/ methacrylic acid/divinylbenzene/methyl methacrylate=84.1/ 2.2/1.2/12.5 (mole %) was subjected to polymerization in the same manner as in 1-1 above to produce a carboxyl group-containing diene type copolymer in the form of particles having an average particle diameter of 0.070 µm [referred to hereinafter as Copolymer (1-2)].

Production of Component (2)

2-1:

Polymerization: In a 10-liter autoclave were placed 5 kg of degassed and dehydrated cyclohexane, 0.25 g of tetrahydrofuran and 1.0 g of n-butyllithium, and thereafter, a mixture of 200 g of 1,3-butadiene and 150 g of styrene was charged into the autoclave at a rate of 7.0 g/min and subjected to isothermal polymerization at 75° C. When the conversion reached 100%, the temperature of the reaction mixture was adjusted to 10° C. and 200 g of tetrahydrofuran was added thereto, after which 500 g of 1,3-butadiene and 50 g of styrene were simultaneously added and subjected to temperature-elevating polymerization. Subsequently, 100 g of styrene was added to the reaction mixture and the resulting mixture was subjected to temperature-elevating polymerization. When the conversion reached approximately 100%, the amount of living Li was measured to find it 10.9 millimoles.

Hydrogenation: To the polymerization system after completion of the above polymerization was added 2.0 g of benzophenone and the resulting mixture was stirred for ten minutes. From the change of color of the polymer solution, it was confirmed that there was no terminal lithium of polymer which lived as a living anion. Subsequently, a reaction product obtained by previously reacting 0.86 g of benzophenone dissolved in 20 ml of cyclohexane with 0.28 g of n-butyllithium for 20 minutes under a nitrogen atmosphere was charged into the autoclave, and a mixture formed by previously mixing 0.36 g of bis(cyclopentadienyl) titanium dichloride and 1.3 g of diethylaluminum chloride dissolved in 10 ml of toluene under a nitrogen atmosphere was charged into the autoclave, and the resulting mixture was stirred. Hydrogen was fed at a pressure of 8 kg/cm$^2$G and hydrogenation was conducted at 90° C. for 40 minutes.

Analysis: The hydrogenation degree of the hydrogenated polymer obtained was 97%, the number average molecular weight was 120,000, the 1,2-vinyl content (referred to hereinafter as the vinyl content) of the 1,3-butadiene measured at the time of completion of the polymerization of the first stage block was 10%, and the vinyl content of the 1,3-butadiene of the second stage block was found 77% as a result of the calculation from the vinyl content in the first stage and the vinyl content measured at the time of completion of the polymerization of the second stage block.

2-2:

Polymerization: In a 10-liter autoclave were placed 5 kg of degassed and dehydrated cyclohexane and 150 g of 1,3-butadiene, and thereafter, 0.25 g of tetrahydrofuran and 0.86 g of n-butyllithium were added thereto, after which the resulting mixture was subjected to temperature-elevating polymerization from 70° C. When the conversion reached 100%, the temperature of the reaction mixture was adjusted to 50° C. and 12.5 g of tetrahydrofuran was added to the reaction mixture, and further 700 g of 1,3-butadiene was added thereto, after which the resulting mixture was subjected to temperature-elevating polymerization. Subsequently, 150 g of styrene was added and subjected to temperature-elevating polymerization. When the conversion reached approximately 100%, the amount of the living Li was measured to find it 9.4 millimoles.

Hydrogenation: To this polymerization system was added 1.72 g of benzophenone, and the resulting mixture was stirred for ten minutes. From the change of color of the polymer, it was confirmed that there was no polymer terminal lithium which lived as a living anion. Subsequently, a reaction product obtained by previously reacting 1.74 g of benzophenone dissolved in 20 ml of cyclohexane with 0.59 g of n-butyllithium for 20 minutes under a nitrogen atmosphere was charged into the autoclave, and a mixture formed by previously mixing 0.44 g of bis(cyclopentadienyl) titanium chloride with 1.6 g of diethylaluminum chloride dissolved in 10 ml of toluene under a nitrogen atmosphere was charged into the autoclave, after which the resulting mixture was stirred. Hydrogen was fed at a pressure of 8 kg/cm²G and hydrogenation was conducted at 90° C. for 40 minutes.

Analysis: The hydrogenation degree of the hydrogenated polymer obtained was 97%, the number average molecular weight was 160,000, the vinyl content of the 1,3-butadiene measured at the time of completion of the polymerization of 1,3-butadiene block in the first stage was 11%, and the vinyl content of the 1,3-butadiene block in the second stage was 40% as a result of calculation from the vinyl content in the first stage and the vinyl content measured at the time of completion of the polymerization of 1,3-butadiene block in the second stage.

2-3:

Polymerization: In a 10-liter autoclave were placed 5 kg of degassed and dehydrated cyclohexane and 300 g of 1,3-butadiene, and thereafter, 0.25 g of tetrahydrofuran and 1.5 g of n-butyllithium were added thereto, after which the resulting mixture was subjected to temperature-elevating polymerization from 70° C. When the conversion reached 100%, the temperature of the reaction mixture was adjusted to 50° C., and 12.5 g of tetrahydrofuran was added thereto, after which 700 g of 1,3-butadiene was added thereto and subjected to temperature-elevating polymerization. Subsequently, 1.2 g of methyldichlorosilane was added thereto and the mixture was subjected to coupling reaction for 30 minutes.

Hydrogenation: Subsequently, a reaction product obtained by previously reacting 4.1 g of benzophenone dissolved in 20 ml of cyclohexane with 1.4 g of n-butyllithium for 20 minutes under a nitrogen atmosphere was charged into the autoclave, and a mixture formed by previously mixing 0.52 g of bis(cyclopentadienyl)titanium dichloride and 1.9 g of diethylaluminum chloride dissolved in 10 ml of toluene under a nitrogen atmosphere was charged into the autoclave, after which the resulting mixture was stirred. Hydrogen was fed at a pressure of 8 kg/cm²G and hydrogenation was conducted at 90° C. for 40 minutes.

Analysis: The hydrogenation degree of the hydrogenated polymer obtained was 96%, the number average molecular weight was 180,000, the vinyl content of the 1,3-butadiene measured at the time of completion of the polymerization of the 1,3-butadiene block in the first stage was 12%, and the vinyl content of the 1,3-butadiene block in the second stage was 40% as a result of calculation from the vinyl content in the first stage and the vinyl content measured at the time of completion of the polymerization of the 1,3-butadiene block in the second stage.

2-4:

Polymerization: In a 10-liter autoclave were placed 5 kg of cyclohexane, 50 g of 1,3-butadiene and 50 g of styrene, and thereafter, 17.5 g of tetrahydrofuran and 0.8 g of n-butyllithium were added thereto, after which the resulting mixture was subjected to temperature-elevating polymerization from 50° C. Subsequently, the temperature of the reaction mixture was adjusted to 50° C., and 600 g of 1,3-butadiene and 200 g of styrene were added thereto, after which the resulting mixture was subjected to temperature-elevating polymerization. Further, 50 g of 1,3-butadiene and 50 g of styrene were added and subjected to temperature-elevating polymerization. When the conversion reached approximately 100%, the amount of living Li was measured to find it 7.5 millimoles.

Hydrogenation: To this polymerization system was added 1.37 g of benzophenone, and the resulting mixture was stirred for ten minutes. From the change of color of the polymer, it was cterminal lithiumere was no polymer terminal lithium which lived as a living anion. Subsequently, a reaction product obtained by previously reacting 1.48 g of benzophenone dissolved in 20 ml of cyclohexane with 0.5 g of n-butyllithium for 20 minutes under a nitrogen atmosphere was charged into the autoclave, and a mixture formed by previously mixing 0.36 g of bis(cyclopentadienyl)titanium dichloride with 1.31 g of diethylaluminum chloride dissolved in 10 ml of toluene under a nitrogen atmosphere was further charged into the autoclave, after which the resulting mixture was stirred. Hydrogen was fed at a pressure of 8 kg/cm²G and hydrogenation was conducted at 90° C. for 45 minutes.

Analysis: The hydrogenation degree of the hydrogenated polymer obtained was 98%, the number average molecular weight was 190,000, the vinyl content of the polymer before the hydrogenation was 50%. This polymer had an X—Y—X structure consisting of the block X of styrene/butadiene (referred to hereinafter as S/B)=5/5 by weight, the block Y of S/B=20/60 by weight and the block X of S/B=5/5 by weight.

2-5:

Polymerization: In a 10-liter autoclave were placed 5 kg of degassed and dehydrated cyclohexane, 20 g of tetrahydrofuran and 50 g of styrene, and thereafter, 0.74 g of n-butyllithium was added thereto, after which the resulting mixture was subjected to temperature-elevating polymerization from 70° C. When the conversion reached 100%, the temperature of the reaction mixture was adjusted to 70° C., and a mixture of 600 g of 1,3-butadiene and 150 g of styrene was added thereto at a rate of 15 g/min in 50 minutes and subjected to isothermal polymerization. Further, 100 g of 1,3-butadiene and 100 g of styrene were simultaneously added and subjected to temperature-elevating polymerization. When the conversion reached approximately 100%, the amount of living Li was measured to find it 6.9 millimoles.

Hydrogenation: To this polymerization system was added 1.26 g of benzophenone, and the resulting mixture was stirred for ten minutes. From the change of color of the polymer solution, it was confirmed that there was no polymer terminal lithium which lived as a living anion. Subsequently, a reaction product obtained by previously reacting 1.58 g of benzophenone dissolved in 20 ml of cyclohexane with 0.54 g of n-butyllithium under a nitrogen atmosphere for 20 minutes was charged into the autoclave, and further, a mixture formed by previously mixing 0.36 g of bis(cyclopentadienyl)titanium dichloride with 1.3 g of diethylaluminum chloride dissolved in 10 ml of toluene was charged into the autoclave, after which the resulting mixture was stirred. Hydrogen was fed at a pressure of 8 kg/cm²G and hydrogenation was conducted at 90° C. for 40 minutes.

Analysis: The hydrogenation degree of the hydrogenated polymer obtained was 97% the number average molecular weight was 180,000, and the vinyl content of the polymer before the hydrogenation was 40 mole %.

The polymer in this example had a structure consisting of a polystyrene block (5 parts by weight) X, a random styrene-butadiene copolymer block of S/B=15/60 (75 parts by weight) Y and a styrene-butadiene copolymer block of S/B=10/10 in which the styrene proportion increased gradually toward the end (20 parts by weight) X.

2-6:

For a comparative example of the component (2), a styrene-butadiene-styrene block copolymer (JSR TR 2000, a trade name of Japan Synthetic Rubber Co., Ltd., bound styrene content: 40% by weight, unhydrogenated) was prepared.

2-7:

For a comparative example of the component (2), a styrene-butadiene-styrene block copolymer (Kraton TR1102, trade name of Shell Chemical, bound styrene content: 28% by weight, unhydrogenated) was prepared.

2-8:

Polymerization: In a 10-liter autoclave were placed 5 kg of degassed and dehydrated cyclohexane, 20 g of tetrahydrofuran and 50 g of styrene, and thereafter, 0.8 g of n-butyllithium was added thereto, after which the resulting mixture was subjected to temperature-elevating polymerization from 70° C. When the conversion reached 100%, the temperature of the reaction mixture was adjusted to 70° C., and a mixture of 700 g of 1,3-butadiene and 230 g of styrene was added thereto at a rate of 19 g/min in 50 minutes, after which the resulting mixture was subjected to isothermal polymerization. Subsequently, 20 g of styrene was added thereto and polymerization was continued. When the conversion reached approximately 100%, the amount of living Li was measured to find it 8.1 millimoles.

Hydrogenation: To this polymerization system was added 1.47 g of benzophenone, and the resulting mixture was stirred for ten minutes. From the change of color of the polymer solution, it was confirmed that there was no polymer terminal lithium which lived as a living anion. Subsequently, a reaction product obtained by previously reacting 1.37 g of benzophenone dissolved in 20 ml of cyclohexane with 0.46 g of n-butyllithium for 20 minutes under a nitrogen atmosphere was charged into the autoclave, and further, a mixture formed by previously mixing 0.36 g of bis(cyclopentadienyl)titanium dichloride with 1.3 g of diethylaluminum chloride dissolved in 10 ml of toluene under a nitrogen atmosphere was charged into the autoclave, after which the resulting mixture was stirred. Hydrogen was fed at a pressure of 8 kg/cm²G and hydrogenation was conducted at 90° C. for 40 minutes.

Analysis: The hydrogenation degree of the hydrogenated polymer obtained was 98%, the number average molecular weight was 160,000 and the 1,2-vinyl content of the 1,3-butadiene of the polymer before the hydrogenation was 40%.

The polymer of this example had a structure consisting of a polystyrene block (5 parts by weight) X, a random styrene-butadiene copolymer block of S/B=23/70 (95 parts by weight) Y and a polystyrene block (2 parts by weight) X.

2-9:

As an example of the component (2), a styrene-ethylene-butene-styrene block copolymer (Kraton G1650, a trade name of Shell Chemical) was prepared.

The properties of the components (2) 2-1 to 2-9 are shown in Table 1.

TABLE 1

| | Properties of the component (2) | | | | | |
|---|---|---|---|---|---|---|
| Kind of polymer | 2-1 | 2-2 | 2-3 | 2-4 | 2-5 | 2-8 |
| Mn ($\times 10^4$) | 12.0 | 16.0 | 18.0 | 19.0 | 18.0 | 16.0 |
| Hydrogenation degree (%) | 97 | 97 | 96 | 98 | 97 | 98 |
| Block structure | X-Y-Z | X-Y-Z' | Z'-Y-Z' | X-Y-X | X-Y-X | X-Y-X |
| Weight ratio of each block | 10/55/35 | 15/70/15 | 15/70/15 | 10/80/10 | 5/75/20 | 5/93/2 |
| Polymer composition (wt. %) | | | | | | |
| Total bound St content | 30 | 15 | 0 | 30 | 30 | 30 |
| Bound Styrene content in block X | 10 | 15 | 0 | 10 | 5/10 | 5/2 |
| Bound Styrene content in block Y | 5 | 0 | 0 | 20 | 15 | 23 |
| Vinyl content in block Y | 77 | 40 | 40 | 50 | 40 | 40 |
| Bound Styrene content in block Z | 15 | 0 | 0 | — | — | — |
| Vinyl content in block Z | 10 | 11 | 12 | — | — | — |

Note: Vinyl content is indicated by mole %.

Evaluation

The evaluation of the photosensitive resin composition of this invention was conducted as follows: A resin layer having a thickness of 0.5 mm was formed on a polyester sheet to prepare a photosensitive resin plate. The resin layer of the above resin plate was brushed in a warm water at 30° C. using a developer (JOW-A4-P) manufactured by Nippon Denshi Seiki K. K. to measure the time required for dissolving the resin layer.

Also, the above resin plate was exposed using an exposure machine (JE-A2-SS) manufactured by Nippon Denshi Seiki K. K. for six minutes, and thereafter, subjected to measurement of tensile strength, elongation at break and impact resilience in accordance with JIS K6301 to obtain the results shown in Table 2.

Preparation of Photosensitive Resin Composition

EXAMPLE 1

With 100 parts of Copolymer 1-1 were compounded 10 parts of the component (2) 2-1, 15 parts of ethylene glycol monomethacrylate (component (3)), 15 parts of trimethylolpropane trimethacrylate (component (3)), 10 parts of N,N-dimethylaminopropyl acrylamide (component (4)), 3 parts of 2,2-dimethoxyphenylacetophenone (component (5)) and 0.5 part of p-t-butylcatechol (the storage stabilizer), and the resulting compound was stirred in a kneader kept at 50° C. for 30 minutes to prepare a photosensitive resin composition. The composition thus obtained was transparent and waxy.

The contents of the composition and the evaluation results were as shown in Table 2. The composition of Example 1 was satisfactory as a flexographic printing plate in respects of the time required for dissolution, tensile strength, elongation at break and impact resilience, and the tensile strength was greatly improved as compared with those in Comparative Examples 1 and 2 which are the prior art.

EXAMPLE 2

The same procedure as in Example 1 was repeated, except that 100 parts of Copolymer 1-2 and 30 parts of the component (2) 2-2 were substituted for the 100 parts of Copolymer 1-1 and the 10 parts of the component (2) 2-1, respectively, to obtain the results shown in Table 2.

EXAMPLE 3

The same procedure as in Example 1 was repeated, except that 10 parts of the component (2) 2-2 was substituted for the 10 parts of the component (2) 2-1, to obtain the results shown in Table 2.

EXAMPLES 4 TO 6

The same procedure as in Example 1 was repeated, except that the components (1) and (2) shown in Table 2 were used in the amounts shown in Table 2 to obtain the results shown in Table 2.

EXAMPLE 7

The same procedure as in Example 1 was repeated, except that 2-diethylaminoethyl methacrylate was substituted for the component (4), to obtain the results shown in Table 2.

All the compositions of this invention had higher water-developability, elongation at break and impact resilience than the practical standard and also were excellent in tensile strength.

EXAMPLES 8 AND 9

The same procedure as in Example 1 was repeated, except that 10 parts of the component (2) 2-8 (Example 8) or 10 parts of the component (2) 2-9 (Example 9) was substituted for the 10 parts of the component (2) 2-1, to obtain the results shown in Table 2.

Comparative Example 1

The same procedure as in Example 1 was repeated, except that the component (2) was not compounded, to obtain the results shown in Table 2.

The water-developability of the composition was good; however, the strength and elongation at break of the composition after the exposure were greatly low.

Comparative Example 2

The same procedure as in Example 1 was repeated, except that 30 parts of an unhydrogenated styrene-butadiene-styrene block copolymer (JSR TR2000, a trade name of Japan Synthetic Rubber Co., Ltd.) was substituted for the 10 parts of the component (2) 2-1, to obtain the results shown in Table 2.

The water-developability of the composition was good; however, the strength of the resin plate after exposure was greatly low and the elongation at break was insufficient.

Comparative Example 3

The same procedure as in Example 1 was repeated, except that a styrene-butadiene-styrene block copolymer (Kraton TR1102, a trade name of Shell Chemical) was substituted for the component (2) 2-1 to obtain the results shown in Table 2. The strength of the resin plate after exposure of the composition obtained was greatly inferior.

TABLE 2

Contents of composition and evaluation results

| | Example | | | | | | | | | Comparative Ex. | | |
|---|---|---|---|---|---|---|---|---|---|---|---|---|
| | 1 | 2 | 3 | 4 | 5 | 6 | 7 | 8 | 9 | 1 | 2 | 3 |
| Component (1) | | | | | | | | | | | | |
| Kind (Copolymer No.) | 1-1 | 1-2 | 1-2 | 1-2 | 1-2 | 1-1 | 1-1 | 1-1 | 1-1 | 1-1 | 1-1 | 1-1 |
| Parts by weight | 100 | 100 | 100 | 100 | 100 | 100 | 100 | 100 | 100 | 100 | 100 | 100 |
| Carboxyl content* | 35.3 | 35.8 | 35.8 | 35.8 | 35.8 | 35.3 | 35.3 | 35.3 | 35.3 | 35.3 | 35.3 | 35.3 |
| Component (2) | | | | | | | | | | | | |
| Kind (component No.) | 2-1 | 2-2 | 2-2 | 2-3 | 2-4 | 2-5 | 2-1 | 2-8 | 2-9 | — | 2-6 | 2-7 |
| Parts by weight | 10 | 30 | 10 | 10 | 10 | 10 | 10 | 10 | 10 | 0 | 30 | 10 |
| Component (3) | | | | | | | | | | | | |
| Nonaethylene glycol monomethacrylate | 15 | 15 | 15 | 15 | 15 | 15 | 15 | 15 | 15 | 15 | 15 | 15 |
| Trimethylolpropane trimethacrylate | 15 | 15 | 15 | 15 | 15 | 15 | 15 | 15 | 15 | 15 | 15 | 15 |
| Component (4) | | | | | | | | | | | | |
| N,N-dimethylaminopropyl-acrylamide | 10 | 10 | 10 | 10 | 10 | 10 | — | 10 | 10 | 10 | 10 | 10 |
| 2-Diethylaminoethyl methacrylate | — | — | — | — | — | — | 10 | — | — | — | — | — |
| Number of moles ($\times 10^{-3}$) | 64.0 | 64.0 | 64.0 | 64.0 | 64.0 | 63.6 | 64.0 | 64.0 | 64.0 | 64.0 | 64.0 | 64.0 |
| Mole ratio*[2] | 1.8 | 1.8 | 1.8 | 1.8 | 1.8 | 1.8 | 1.8 | 1.8 | 1.8 | 1.8 | 1.8 | 1.8 |
| Component (5) | | | | | | | | | | | | |
| 2,2-Dimethoxyphenyl acetophenone | 3 | 3 | 3 | 3 | 3 | 3 | 3 | 3 | 3 | 3 | 3 | 3 |
| Stabilizer (p-t-butyl-catechol) | 0.5 | 0.5 | 0.5 | 0.5 | 0.5 | 0.5 | 0.5 | 0.5 | 0.5 | 0.5 | 0.5 | 0.5 |

TABLE 2-continued

| | Contents of composition and evaluation results | | | | | | | | | | | |
|---|---|---|---|---|---|---|---|---|---|---|---|---|
| | Example | | | | | | | | | Comparative Ex. | | |
| | 1 | 2 | 3 | 4 | 5 | 6 | 7 | 8 | 9 | 1 | 2 | 3 |
| (Evaluation results) | | | | | | | | | | | | |
| Time required for dissolution (sec) | 73 | 40 | 70 | 75 | 76 | 74 | 75 | 73 | 77 | 55 | 60 | 72 |
| Tensile strength (kgf/cm$^2$) | 43 | 58 | 48 | 42 | 49 | 48 | 49 | 48 | 38 | 29 | 35 | 21 |
| Elongation at break (%) | 70 | 80 | 70 | 70 | 75 | 80 | 80 | 80 | 70 | 55 | 60 | 55 |
| Impact resilience | 33 | 34 | 31 | 32 | 33 | 32 | 34 | 33 | 31 | 33 | 30 | 30 |

Note:
*[1] Amount of carboxyl group contained in 100 parts by weight of the component (1) ($10^{-3}$ mole)
*[2] Mole ratio of the component (4) to the carboxyl group in the component (1)

The photosensitive resin composition of this invention are excellent in water-developability and strength of the composition after exposure and good in elongation at break of the composition after exposure and impact resilience. Also, the composition of this invention can be freely adjusted from the fluidity-free waxy or rubbery state to the low viscosity liquid state. Accordingly, the composition of this invention can be very appropriately used as a photosensitive material in the fields of photoresist, plate making, printing ink and the like, and in addition, is also useful as a photosensitive coating material, photosensitive adhesive, photomolding material and the like.

What is claimed is:

1. A water-developable photosensitive resin composition which comprises:

(1) a carboxyl group-containing diene cross-linkable copolymer composed of:
      (i) 40–95 mole % of a recurring unit consisting of a conjugated diene,
      (ii) 0.1–20 mole % of a recurring unit consisting of an α,β-ethylenically unsaturated carboxylic acid,
      (iii) 0.1–10 mole % of a recurring unit consisting of a compound other than (i) having at least two ethylenically unsaturated groups in the molecule, and
      (iv) 0–40 mole % of at least one monomer selected from the group consisting of aromatic vinyl compounds, alkyl (meth)acrylates and acrylonitrile;
   (2) a hydrogenated diene block polymer having a number average molecular weight of 50,000 to 600,000:
   (3) a photopolymerizable ethylenically unsaturated compound;
   (4) an amino group-containing compound; and
   (5) a photopolymerization initiator, wherein
   the hydrogenated diene block polymer (2) is selected from the group consisting of a X—Y—X block copolymer, a X—Y—Z block copolymer, a X—Y'—Z' block copolymer and a Z'—Y'—Z' block copolymer, wherein X, Y, Z, Y' and Z' are segments as defined below and at least 90 mole % of the conjugated diene polymer portion in the block polymer has been hydrogenated:

Segment X: a segment composed of an aromatic vinyl polymer or a copolymer of a conjugated diene and at least 45% by weight of an aromatic vinyl compound is copolymerized,
   Segment Y: a segment composed of a random copolymer of a conjugated diene and 10–30% by weight of an aromatic vinyl compound is copolymerized, the vinyl content of the microstructure of the conjugated diene polymer portion being 30–85 mole %, said segment occupying 50–95% by weight of the block polymer,
   Segment Z: a segment composed of a random copolymer of a conjugated diene and less than 45% by weight of an aromatic vinyl compound, the vinyl content of the microstructure of the conjugated diene polymer portion of the segment being less than 20 mole %,
   Segment Y': a segment composed of a conjugated diene polymer in which the vinyl content of the microstructure of the conjugated diene polymer portion being 30–85 mole %, said segment occupying 40–80% by weight of the block polymer,
   Segment Z': a segment composed of a conjugated diene polymer having a vinyl content of less than 20 mole %.

2. The photosensitive resin composition according to claim 1, wherein the carboxyl group-containing diene cross-linkable copolymer (1) consists of:
   (i) 70–95 mole % of a recurring unit consisting of at least one member selected from the group consisting of butadiene and isoprene,
   (ii) 0.5–5 mole % of a recurring unit consisting of an α,β-ethylenically unsaturated carboxylic acid,
   (iii) 0.5–5 mole % of a recurring unit consisting of at least one member selected from group consisting of an alkylene glycol di(meth)acrylate and divinylbenzene,
   (iv) 5–30 mole % of a recurring unit consisting of at least one monomer selected from the group consisting of aromatic vinyl compounds, alkyl (meth)acrylates and acrylonitrile, and is in the form of particles having an average particle diameter of 0.02–1 μm.

3. The photosensitive resin composition according to claim 1, wherein the hydrogenated diene block polymer (2) is a block copolymer of styrene and at least one conjugated diene selected from the group consisting of butadiene and isoprene.

4. The photosensitive resin composition according to claim 1, wherein the photopolymerizable ethylenically unsaturated compound (3) is selected from the group consisting of nonaethylene glycol monomethacrylate, trimethylolpropane trimethacrylate, lauryl (meth)acrylate, hexanediol di(meth)acrylate, ethylene glycol di(meth)acrylate and dipentaerythritol hexa(meth)acrylate.

5. The photosensitive resin composition according to claim 1, wherein the amino group-containing compound (4) is at least one member selected from the group consisting of N,N-dimethylaminopropyl acrylamide, N,N-diethylaminoethyl (meth)acrylamide N,N-dimethylaminoethyl (meth)acrylamide, 2-diethylaminoethyl methacrylate, 2-dimethylaminoethyl (meth)acrylate, 2-diethylaminopropyl (meth)acrylate, and 2-dimethylaminopropyl (meth)acrylate.

6. The photosensitive resin composition according to claim 1, which comprises 100 parts by weight of the carboxyl group-containing diene cross-linkable copolymer (1), 0.1–100 parts by weight of the hydrogenated diene block polymer (2), 10–10,000 parts by weight of the photopolymerizable ethylenically unsaturated compound (3), 0.5–3 mole of the amino group-containing compound per mole of the carboxyl group of the component (1), and 0.1 to 20 parts by weight of the photopolymerization initiator (5).

7. A photosensitive resin composition for flexographic printing plate consisting of the composition according to claim 1, wherein per 100 parts by weight of the carboxyl group-containing diene cross-linkable copolymer (1), the amount of the hydrogenated diene block polymer (2) is 5–50 parts by weight, the amount of the photopolymerizable ethylenically unsaturated compound (3) is 10–100 parts by weight and the amount of the photopolymerization initiator (5) is 0.1–10 parts by weight, and the amount of the amino group-containing compound (4) is 0.5–3 moles per mole of the carboxyl group of the component (1).

8. The photosensitive resin composition according to claim 1, wherein 96 to 98 mole % of the conjugated diene polymer in the block polymer has been hydrogenated.

9. The water developable photosensitive resin composition of claim 1, wherein the hydrogenated diene block polymer (2) is a X—Y—X block copolymer, wherein one or both of the X's is or are a segment or segments composed of a conjugated diene-aromatic vinyl compound copolymer in which at least 45% by weight of an aromatic vinyl compound is copolymerized with a conjugated diene so that the proportion of the aromatic vinyl polymer portion increases gradually toward the end.

10. A flexographic printing resin plate consisting essentially of a substrate and a layer of the photosensitive resin composition according to claim 1, formed on the substrate.

* * * * *